United States Patent [19]

Christou et al.

[11] 4,330,343
[45] May 18, 1982

[54] REFRACTORY PASSIVATED ION-IMPLANTED GAAS OHMIC CONTACTS

[75] Inventors: Aristos Christou, Springfield; John E. Davey, Alexandria, both of Va.

[73] Assignee: The United States of America as represented by the Secretary of the Navy, Washington, D.C.

[21] Appl. No.: 214,926

[22] Filed: Dec. 10, 1980

Related U.S. Application Data

[63] Continuation-in-part of Ser. No. 1,031, Jan. 4, 1979, Pat. No. 4,263,605.

[51] Int. Cl.³ .................. H01L 7/54; H01L 7/36; H01L 23/48
[52] U.S. Cl. .................. 148/1.5; 148/187; 357/61; 357/67; 357/91
[58] Field of Search .................. 148/1.5, 187; 357/61, 357/65, 91

[56] References Cited

U.S. PATENT DOCUMENTS 3,909,307  8/1975  Stein .................. 148/1.5
3,943,556  3/1976  Wilson .................. 357/74
3,987,480  10/1976  Diguet et al. .................. 357/65
4,141,022  2/1979  Siggs et al. .................. 357/67
4,298,403  11/1981  Davey et al. .................. 148/1.5

OTHER PUBLICATIONS

Favennec et al., Solid St. Electronics, 21, (1978), 705.
Ho et al., IBM-TDB, 21, (1978), 1952.
Jaros et al., Solid St. Electronics, 18, (1975), 1029.
Kung et al., Electronics Letters, 13, (Mar. 1977), 187.

*Primary Examiner*—Upendra Roy
*Attorney, Agent, or Firm*—Robert F. Beers; William T. Ellis; Kenneth E. Walden

[57] ABSTRACT

A method of attaining n+ regions with fine planar geometry in the source and drain of GaAs devices utilizing ion implantation which improves ohmic contact with a refractory film. A layer of TiW refractory film is deposited on GaAs. $^{29}$Si ions are implanted in the GaAs through the refractory film so that the peak concentration is no more than approximately 100Å below the TiW-GaAs interface. The entire structure is then annealed. A gold overlay is then deposited on the TiW layer to which electrical contacts may be attached and by which the contact resistivity is measured. Typical specific contact resistivity values are in the low $10^{-6}$ ohm/cm² range.

11 Claims, 3 Drawing Figures 4,330,343

REFRACTORY PASSIVATED ION-IMPLANTED GAAS OHMIC CONTACTS

CROSS-REFERENCE TO RELATED APPLICATION

This application is a continuation-in-part of Application Ser. No. 001031 filed Jan. 4, 1979 and now issued as U.S. Pat. No. 4,263,605.

BACKGROUND OF THE INVENTION

This invention relates to GaAs semiconductor devices and, more particularly, to improvement of refractory passivated GaAs ohmic contacts by ion implantation.

Heretofore, ohmic contacts for GaAs FET devices have used an AuGeNi layer on GaAs wherein the AuGeNi-GaAs device is heated to the point that the AuGeNi layer and adjacent area of the GaAs melts. Once they have melted, the germanium diffuses into the GaAs to form with the GaAs an ohmic contact with increased carrier concentration that induces tunneling. The ohmic contact is not always reliable—it shows island formations or balling-up and deterioration with aging.

A TiW passivation layer has been deposited on epitaxial silicon structures which deteriorate with age and high temperature operation.

U.S. Pat. No. 3,909,307 implants doping atoms into a thin epitaxial layer of silicon on a substrate so that they are along the boundary layer. The atoms reduce or eliminate boundary changes which normally occur during growth.

SUMMARY OF THE INVENTION

This invention improves GaAs devices by the use of ion implantation to attain an $n^+$ region with fine planar geometry in the source and drain. Advantages of such devices are: ohmic contacts which can achieve reproducible low contact resistivity, which will not show island formation or balling up on the surface, and which will not deteriorate on aging.

DETAILED DESCRIPTION

Figure 1:
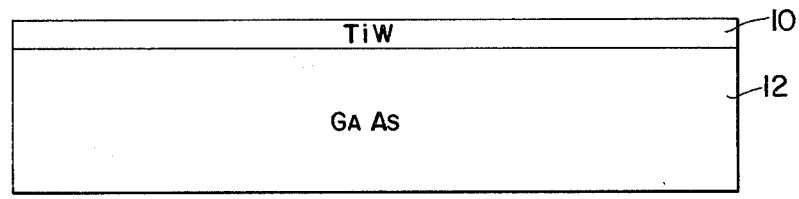
FIG. 1 illustrates a TiW passivated GaAs device.
Figure 2:
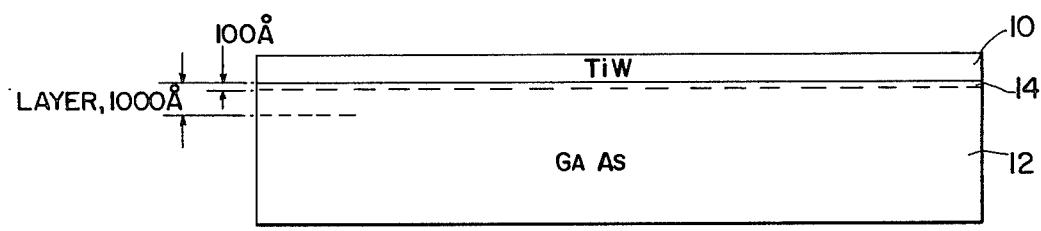
FIG. 2 illustrates the device shown in FIG. 1 with ions implanted therein.
Figure 3:
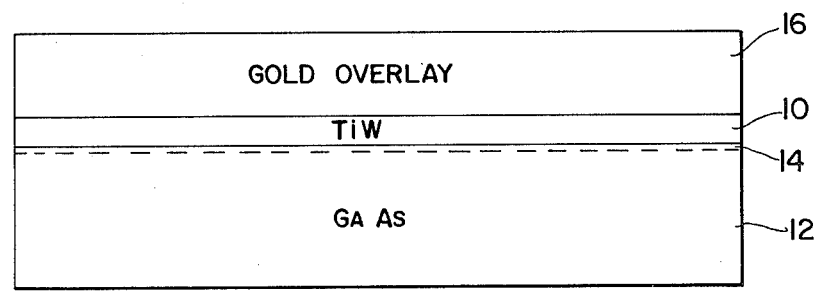
FIG. 3 illustrates the device of FIG. 2 with a gold layer deposited thereon with which electrical contacts are made.

In carrying out this invention, one is concerned with developing an ohmic contact with the top surface of a gallium arsenide semiconductor. Initially, a 400–700 Å layer 10 of TiW refractory film is deposited onto the surface of a GaAs semiconductor 12 as shown in FIG. 1. The TiW layer serves to initially passivate the surface of the GaAs. Subsequent to applying the TiW layer onto one surface of the GaAs, the TiW layered GaAs is placed into an ion implantation system which implants ions through the TiW layer. The peak concentration within the GaAs of the implanted ions is no more than 100 Å below the TiW layer—GaAs interface, thereby forming an ion doped layer 14 within the GaAs. A suitable ion source being $^{29}$Si ions at 60 KeV with a minimum dose of $1 \times 10^{14}$ ions/cm$^2$. The ions are implanted until the ion concentration within the ion-doped layer is at least $1 \times 10^{14}$ ions/cm$^2$. After the ions have been implanted, the entire structure is annealed at 700° C. for 30 minutes. Annealing of the implanted ion structure activates the ions to produce an $n^+$ layer having a thickness of about 1000 Å with a peak carrier concentration of $1 \times 10^{18}$ cm$^{313}$. The TiW layer passivates and contains the GaAs during annealing. It forms a refractory layer which becomes a part of the ohmic contact and serves as a metal contact to the $n^{30}$ layer produced by the ion implantation to achieve low contact resistance.

Subsequent to annealing the structure, a gold overlay 16 of about 3000 Å is deposited onto the TiW layer such as by evaporation, sputtering or electroplating. Measurements of contact resistivity values have shown that low resistivity values of about $10^{-6}$ ohms/cm$^2$ have been obtained. Such low resistivity values make such devices suitable for small-signal devices.

The invention has been set forth above by way of example using $^{29}$Si ions for the ion implantation in order to achieve the $n^+$ layer. It has been determined that Se or Ge ions may also be used. Further, although the refractory material has been set forth as TiW, other refractory material such as tantalum, platinum, tungsten or molybdenum, may be used to passivate the GaAs. The energy and dose of the implanted ions are such that the peak surface concentration is at least $1 \times 10^{14}$ ions per sq. cm.

The use of refractory passivating films in combination with ion implantation achieves low ohmic contact resistance in GaAs devices with considerable improvement in reliability. The refractory layer becomes part of the ohmic contact which prevents island formation or balling-up and serves as the metal contact to the $n^+$ layer produced by ion implantation which increases the carrier concentration to induce tunneling.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method for forming an improved ohmic contact for semiconductors comprising the steps of:
   depositing a layer of refractory material on a N-type GaAs base material to form a refractory mask;
   implanting ions through the refractory mask to establish an $n^+$ region in the GaAs base material with a peak concentration within about 100 Å of the refractory mask-GaAs interface.
   annealing the implanted structure to activate the implanted ions; and
   depositing a gold overlay on the refractory mask.

2. The method according to claim 1 comprising the step of depositing a refractory mask selected from the group consisting of TiW, Ta, W, Pt, and Mo to a thickness of from 400–800 Å.

3. The method according to claim 1 or 2 comprising the step of selecting an implantation material from the group consisting of $^{29}$Si, Se and Ge.

4. The method according to claim 3 where said ions are implanted at 60 KeV with a minimum dosage of $1 \times 10^{14}$ ions per cm$_2$ until the ion concentration within said GaAs is at least $1 \times 10^{14}$ ions per cm$^2$.

5. The method according to claim 3 comprising the step of annealing the structure at about 700° C. for about 30 minutes.

6. The method according to claim 4 comprising the step of annealing the structure at about 700° C. for about 30 minutes.

7. The method according to claim 1 or 2 comprising the step of annealing the structure at about 700° C. for about 30 minutes.

8. The invention according to claim 1 wherein the gold overlay is deposited to a thickness of about 3000 A.

9. The invention according to claim 1 or 8 wherein the gold overlay is deposited by evaporation.

10. The invention according to claim 1 or 8 wherein the gold overlay is deposited by sputtering.

11. The invention according to claim 1 or 8 wherein the gold overlay is deposited by electroplating.

* * * * *